United States Patent [19]
Kim et al.

[11] Patent Number: 5,985,491
[45] Date of Patent: *Nov. 16, 1999

[54] REFLECTORS FOR PHOTOLITHOGRAPHIC PROJECTION AND RELATED SYSTEMS AND METHODS

[75] Inventors: Cheol-hong Kim; Chang-jin Sohn, both of Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/664,535

[22] Filed: Jun. 17, 1996

[30] Foreign Application Priority Data

Sep. 13, 1995 [KR] Rep. of Korea ............ 95-29835

[51] Int. Cl.⁶ .................. G03F 9/00; G02B 5/08
[52] U.S. Cl. ............... 430/4; 430/5; 430/321; 355/45; 359/360; 359/361; 359/584; 359/838; 359/884
[58] Field of Search .................. 430/4, 5, 321; 359/838, 839, 884, 583, 584, 589, 614, 636, 359, 360, 361, 581; 355/45

[56] References Cited

U.S. PATENT DOCUMENTS

| | | | |
|---|---|---|---|
| 5,040,882 | 8/1991 | Markle | 359/727 |
| 5,128,194 | 7/1992 | Sorko-Ram | 428/172 |
| 5,153,083 | 10/1992 | Garofalo et al. | 430/5 |
| 5,177,646 | 1/1993 | Lee | 360/60 |
| 5,194,346 | 3/1993 | Rolfson et al. | 430/5 |
| 5,267,081 | 11/1993 | Pein | 359/584 |
| 5,288,568 | 2/1994 | Cathy, Jr. | 430/5 |
| 5,302,477 | 4/1994 | Dao et al. | 430/5 |
| 5,305,054 | 4/1994 | Suzuki et al. | 355/53 |
| 5,328,784 | 7/1994 | Fukuda | 430/5 |
| 5,342,713 | 8/1994 | Ohtsuka et al. | 430/5 |
| 5,432,588 | 7/1995 | Kamon | 355/71 |
| 5,436,692 | 7/1995 | Noguchi | 355/53 |
| 5,468,578 | 11/1995 | Rolfson | 430/5 |
| 5,503,950 | 4/1996 | Miyake et al. | 430/5 |
| 5,536,606 | 7/1996 | Doan | 430/5 |
| 5,563,009 | 10/1996 | Bae | 430/5 |
| 5,565,052 | 10/1996 | Papenburg et al. | 156/155 |
| 5,640,284 | 6/1997 | Tanitsu et al. | 359/869 |
| 5,684,567 | 11/1997 | Shiozawa | 355/67 |

FOREIGN PATENT DOCUMENTS

0 529 338  3/1993  European Pat. Off. .......... G03F 1/14

*Primary Examiner*—Bernard Codd
*Attorney, Agent, or Firm*—Myers Bigel Sibley & Sajovec

[57] ABSTRACT

A photolithographic projection system for selectively irradiating a photosensitive layer on a wafer according to a predetermined pattern on a mask is discussed. The photolithographic projection system includes a radiation source which generates radiation such as light. A reflector reflects the radiation from the radiation source on a path which intersects the wafer. This reflector includes a radiation reflecting portion and a phase-shifting and partially reflecting portion adjacent the radiation reflecting portion. The reflecting portion may include a plurality of reflecting portions surrounded by the absorbing portion, or the reflecting portion may surround the absorbing portion. Alternately, the reflector may include a reflecting portion and an absorbing portion adjacent the reflecting portion. Related methods are also discussed.

6 Claims, 10 Drawing Sheets

REFLECTORS FOR PHOTOLITHOGRAPHIC PROJECTION AND RELATED SYSTEMS AND METHODS

FIELD OF THE INVENTION

The present invention relates to microelectronic processing and more particularly to photolithographic processing.

BACKGROUND OF THE INVENTION

Photolithographic processing techniques are used to create patterned layers for microelectronic structures. Each of the patterned layers can be used as an element of a microelectronic device being fabricated, as a mask for a dopant being provided to the substrate below or for other purposes such as an etch mask.

Typically, a photoresist layer is formed on a layer to be patterned. This photoresist layer is selectively exposed to radiation such as light and then developed to form a patterned photoresist layer. This patterned photoresist layer serves as a mask when etching the layer beneath. By etching the portions of a layer exposed by the patterned photoresist layer, the pattern of the photoresist layer can be transferred to the layer below.

As the line widths of microelectronic devices have been reduced to 0.35 $\mu$m and smaller, the limits of resolution and the depth of focus (DOF) available through conventional i-line illumination systems may be exceeded. Accordingly, conventional illumination systems may be inadequate for the production of microelectronic devices requiring relatively narrow line widths. In particular, the line widths required for a 256 M dynamic random access memory have prompted the development of improved illumination systems. For example, illumination systems using KrF excimer lasers have been developed.

Figure 1:
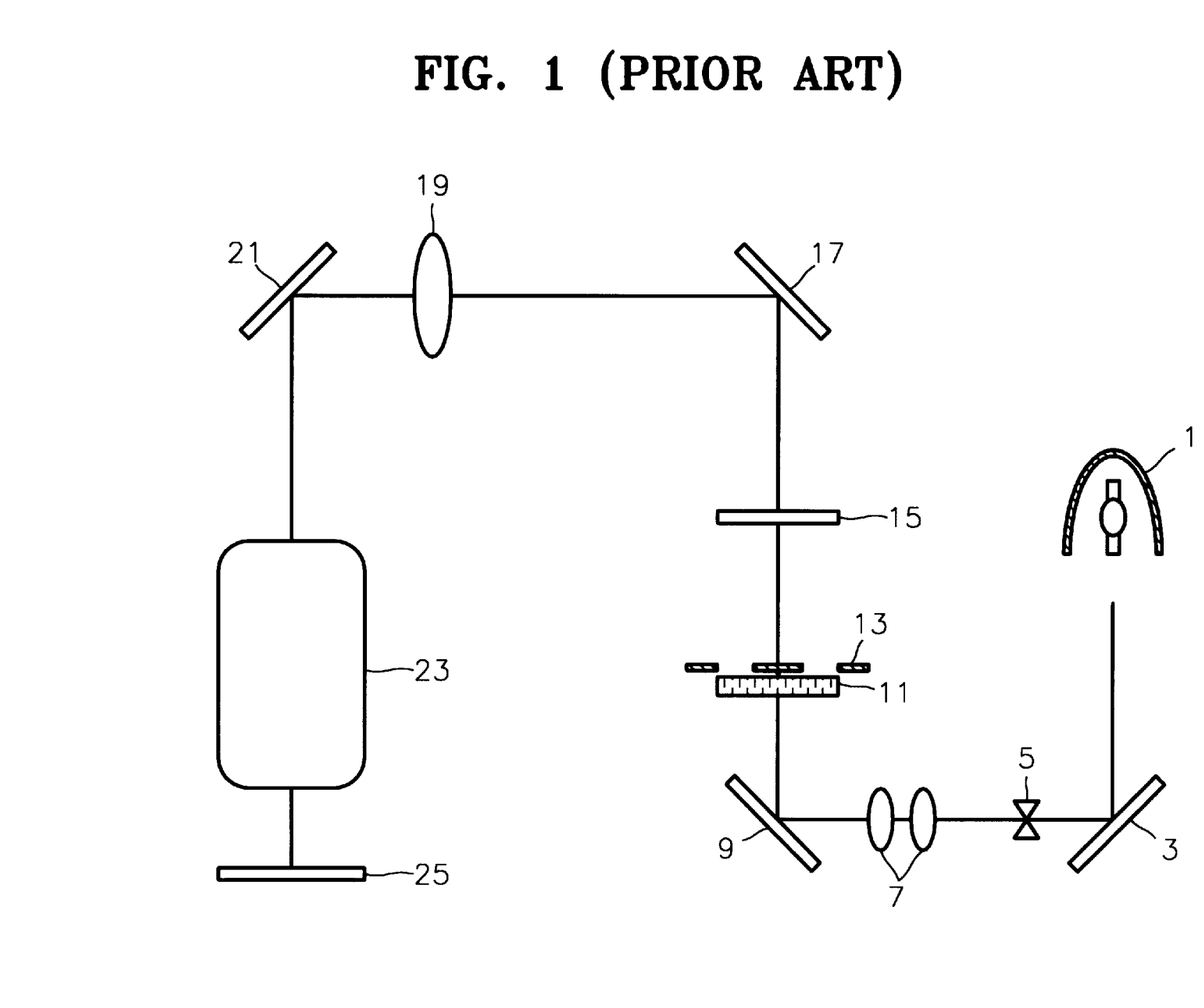
FIG. 1 is a schematic diagram illustrating a projection exposure system according to the prior art.
Figure 2:
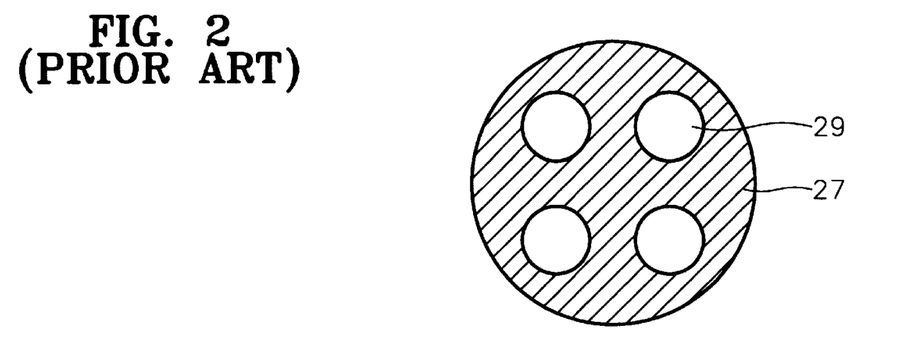
FIGS. 2–5 are plan views illustrating apertures for the projection exposure system of FIG. 1.

A conventional projection exposure system for photolithographic processing is illustrated in FIG. 1. The components of this projection exposure system include a light source 1, a first reflector 3, a shutter 5, filters 7, a second reflector 9, a fly's eye lens 11, an aperture 13, a photomask 15, a third reflector 17, a condenser lens 19, a fourth reflector 21, and an object lens 23. This system is used to project an image of the mask 15 onto the wafer 25. The light generated by the light source 1 is transmitted to the wafer 25 along the light path as illustrated.

A component of the light generated by the light source is transmitted to the wafer using the aperture 13. The aperture can be a quadruple aperture or an annular aperture. Both an annular aperture and a quadruple aperture may have the effects of phase-shift and semi-transmission. The modified illumination transmitted through the aperture 13 includes a component with oblique incidence. This modified illumination may also have a component with vertical illumination. Accordingly, resolution and depth of field may be increased when a pattern is formed. Various apertures for conventional projection exposure systems are illustrated in FIGS. 2–5. The quadruple aperture of FIG. 2 has four symmetrically arranged portions 29 which transmit light. Furthermore, a central portion 27 of the aperture blocks light so that only off-axis illumination is transmitted by the aperture.

Figure 3:
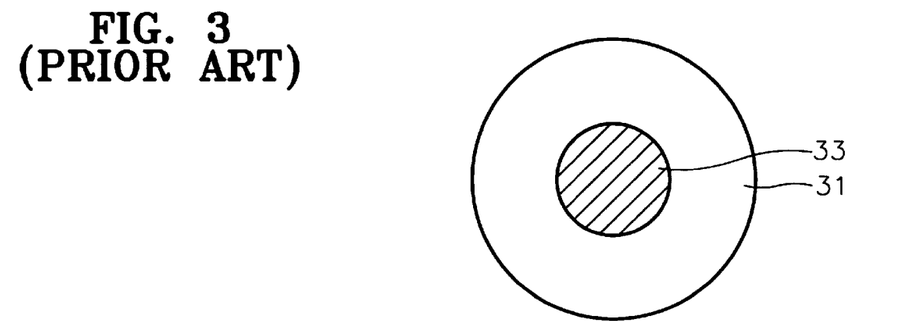

An annular aperture is illustrated in FIG. 3. In the annular aperture of FIG. 3, a circular light blocking portion 31 is located in the center of the aperture. A light transmitting portion 33 forms an annulet surrounding the light blocking portion 31. The annular aperture may be generally more effective in the generation of illumination with an oblique incidence than a quadruple aperture.

Figure 4:
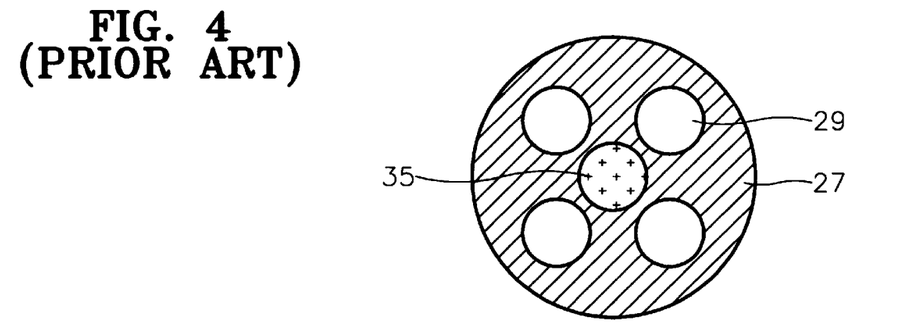
Figure 5:
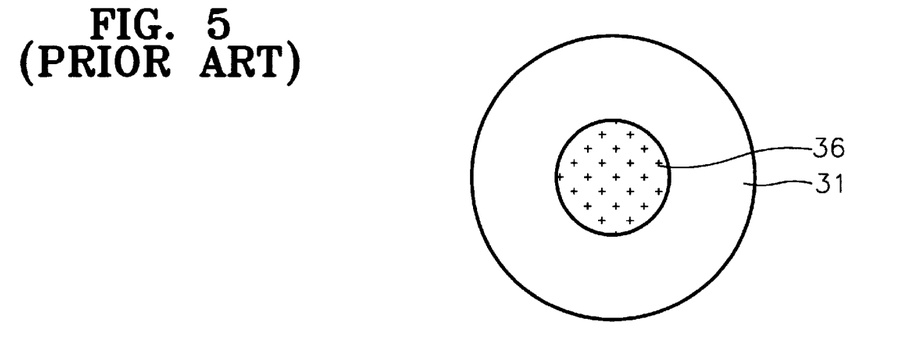

In addition, a central region 35 of a quadruple aperture can provide a phase-shift of 180° and allow the semi-transmission of light, as shown in FIG. 4. Similarly, a central region 36 of an annular aperture can provide a phase-shift of 180° and allow the semi-transmission of light, as shown in FIG. 5.

Figure 6:
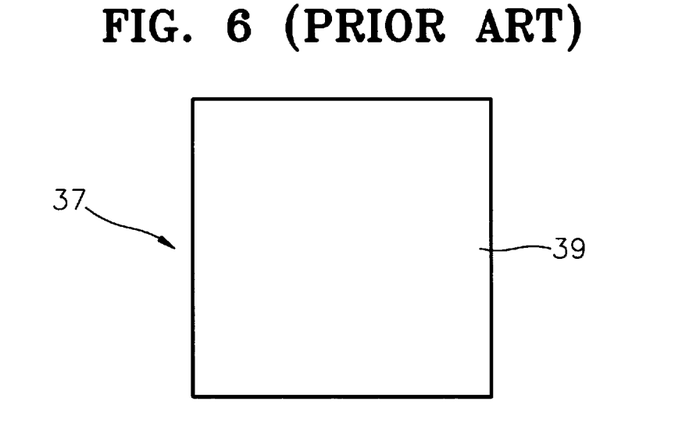
FIG. 6 is a plan view illustrating a reflector for the projection exposure system of FIG. 1.

A conventional reflector 37 for a projection exposure system is illustrated in FIG. 6. The reflector 37 has a surface 39 for reflecting nearly 100% of the light incident thereon.

According to the conventional projection exposure system, the light transmitted through the aperture 13 to the mask 15 has an oblique incident component. Even though the light intensity may be uniformly controlled by the fly's eye lens 11, diffraction generated by the aperture 13 may result in nonuniform light intensity of the wafer. Accordingly, it may be difficult to generate uniform line widths on the wafer 25.

SUMMARY OF THE INVENTION

It is therefore an object of the present invention to provide improved photolithographic projection systems.

It is another object of the present invention to provide improved reflectors for a photolithographic projection system.

It is still another object of the present invention to provide improved methods for fabricating reflectors for photolithographic projection systems.

These and other objects are provided according to the present invention by a reflector including a light reflecting portion and a light absorbing portion adjacent the light reflecting portion. The light reflecting portion may include a plurality of light reflecting portions surrounded by the light absorbing portion, or the light reflecting portion may surround the light absorbing portion. Alternately, the reflector may include a light reflecting portion and a phase-shifting and partially reflecting portion adjacent the light reflecting portion. Projection systems using these reflectors can thus provide a uniform light intensity and irradiating angle to a wafer being exposed. In addition, diffraction of the light provided to the wafer can be reduced. Accordingly, the uniformity of line widths formed on the wafer can be increased.

The light reflecting portions preferably have a reflectivity on the order of at least 80%. The phase-shifting and partially reflecting portions may have a reflectivity on the order of 5–30% and may shift a phase of light reflected therefrom on the order of 90–270°. Most preferably, the phase is shifted 180°.

According to another aspect of the present invention, a method for fabricating a reflector for a photolithographic projection system includes the steps of selectively forming a light absorbing layer on a first portion of a substrate and selectively forming a light reflecting layer on a second portion of the substrate. The light reflecting layer may surround the light absorbing layer to thereby provide an annular reflector.

Alternately, a method for fabricating a reflector for a photolithographic projection system may include the steps of forming a groove in the substrate, selectively forming a first light reflecting layer in the groove, and selectively forming a second light reflecting layer on the substrate around the groove. The groove is preferably formed by etching a portion of the substrate left exposed by a patterned photoresist layer. In particular, the substrate can be etched using a reactive ion etch.

According to yet another aspect of the present invention, a reflector for a photolithographic projection system can be fabricated by a method including the steps of forming a light reflecting layer on a first surface of a substrate, and selectively forming a phase-shifting layer on a portion of the second surface of the substrate opposite the first surface. The phase-shifting layer can be formed in a groove on the substrate, which can be formed by etching the substrate.

The present invention thus reduces diffraction of light during exposure of a photoresist layer when compared to conventional photolithographic processing techniques. Accordingly, the uniformity of line widths produced can be increased thereby allowing the production of integrated circuits with reduced line widths.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 7:
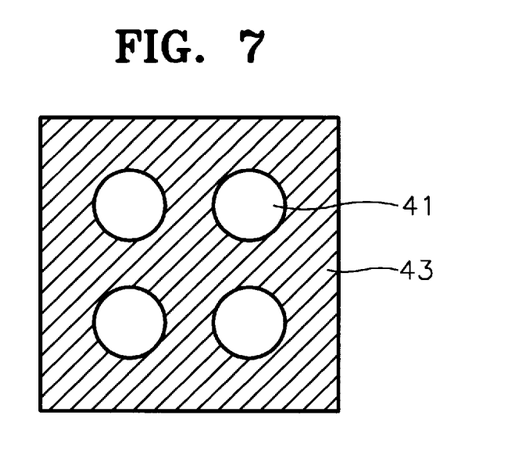
FIGS. 7–10 are plan views illustrating reflectors for a projection exposure system according to the present invention.
Figure 8:
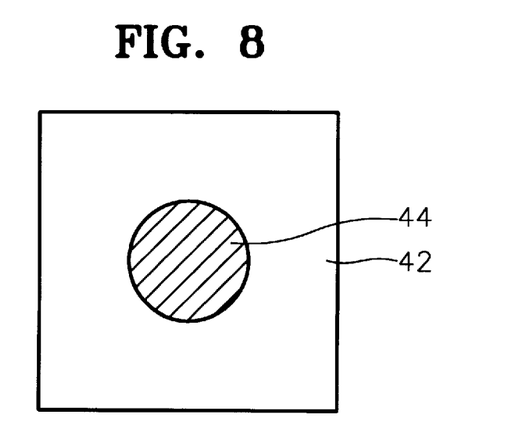
Figure 9:
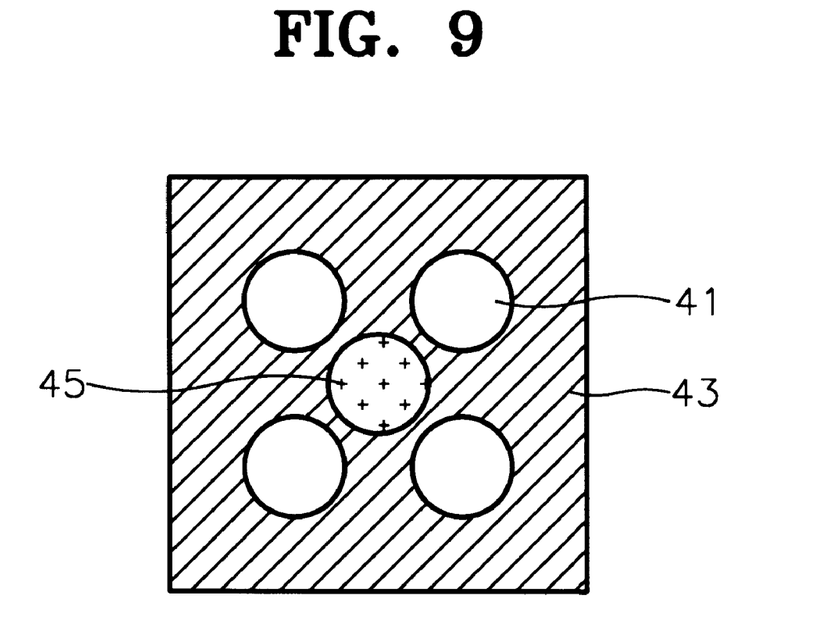
Figure 10:
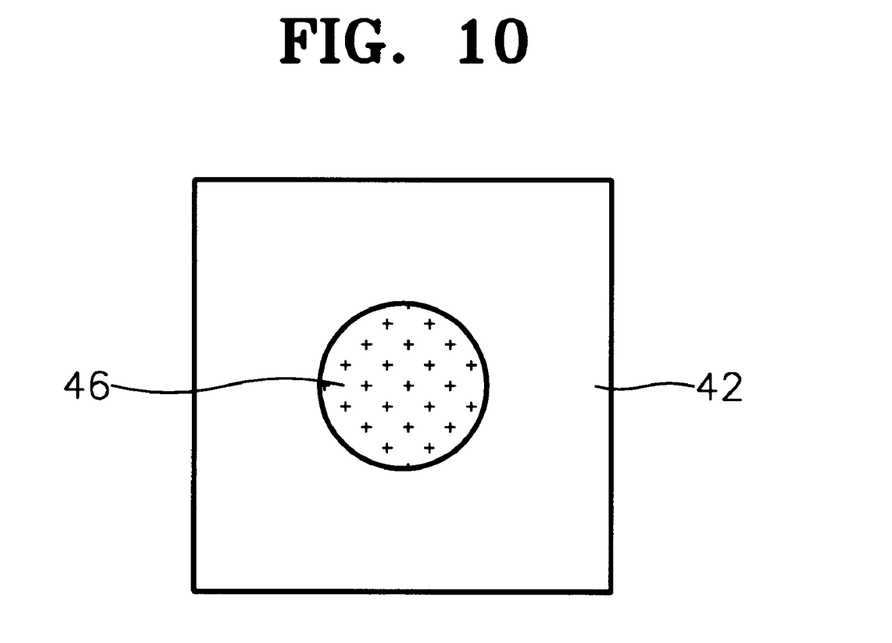

A plan view of a quadruple reflector according to the present invention is illustrated in FIG. 7. This quadruple reflector includes total light reflecting portions 41 and a total light absorbing portion 43. A plan view of an annular reflector according to the present invention is illustrated in FIG. 8. This annular reflector includes a total light reflecting portion 42 and a total light absorbing portion 44. In FIG. 9, a quadruple reflector includes a phase-shifting and partially reflecting portion 45 which may be formed in a central region of the quadruple reflector. An annular reflector including a phase-shifting and partially reflecting portion 46 is illustrated in FIG. 10. The phase-shifting and partially reflecting portion 46 may be formed in a central region of the annular reflector.

The total light reflecting portions 41 and 42 of the reflectors discussed above preferably have an optical reflectivity of at least 80 percent. The phase-shifting and partially reflecting portions 45 and 46 may be in the form of a circle, an oval, or a polygon. The phase-shifting and partially reflecting portions 45 and 46 preferably have a reflectivity on the order of 5–30%. In addition, the light reflected from these portions preferably experiences a phase-shift on the order of 90°–270°, and more preferably the phase-shift is on the order of 180°.

The phase of the reflected light may be shifted by altering the length of the path traveled by the light reflected from the phase-shifting portions 45 and 46. The length of the path traveled by the reflected light may be altered by etching the substrate of the reflector, by forming a layer of a phase-shifting material on the substrate, or by both etching the substrate and forming a layer of a phase-shifting material. Preferably, the phase-shifting material is chosen from the group consisting of SOG, CrO, CrON, CrOCN, MoSiO, MoSiON, and tungsten silicide (W/Si).

Figure 11:
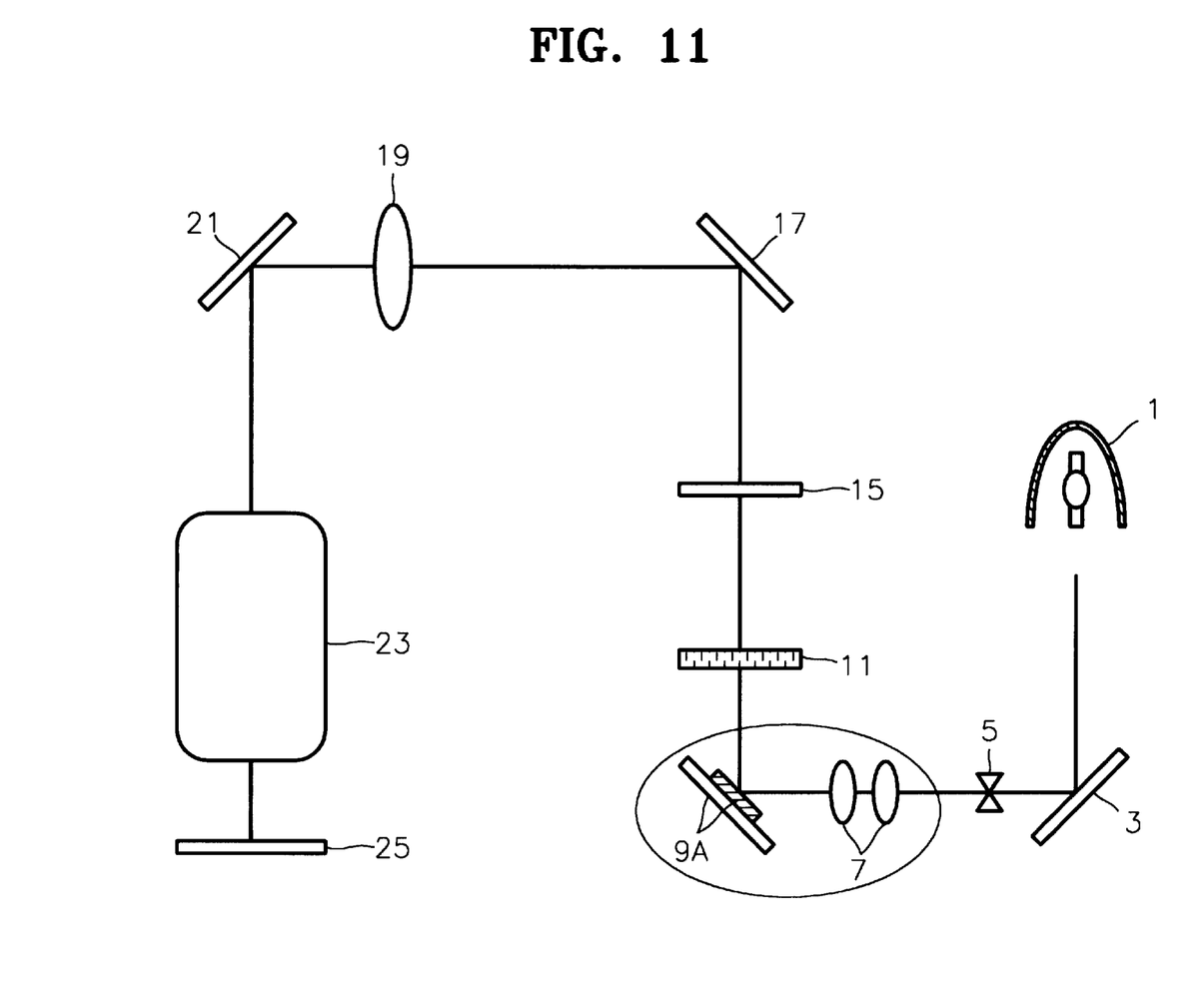
FIG. 11 is a schematic diagram illustrating a projection exposure system according to the present invention.

A projection exposure system including a reflector according to the present invention is illustrated in FIG. 11. This projection exposure system uses a second reflector 9A as discussed above with regard to FIGS. 7–10. In particular, when the quadruple reflector of FIG. 7 or the annular reflector of FIG. 8 is used, light including an off-axis illumination component is transmitted onto the mask 15. When the quadruple reflector of FIG. 9 or the annular reflector of FIG. 10 is used for the second reflector, the light (or other electromagnetic radiation) transmitted to the mask also includes a direct illumination component in addition to the off-axis illumination component.

A modified reflector according to the present invention can transmit a diffraction-free illumination component of uniform intensity and irradiating angle. Accordingly, the uniformity of line widths formed on the wafer via a photolithographic projection system using a reflector according to the present invention can be enhanced.

Figure 12:
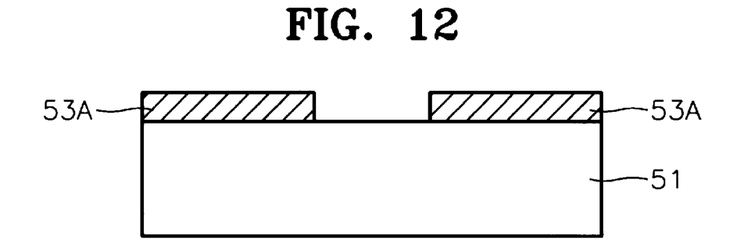
FIGS. 12–16 are sectional views showing sequential steps of a method for fabricating an annular reflector according to the present invention.
Figure 13:
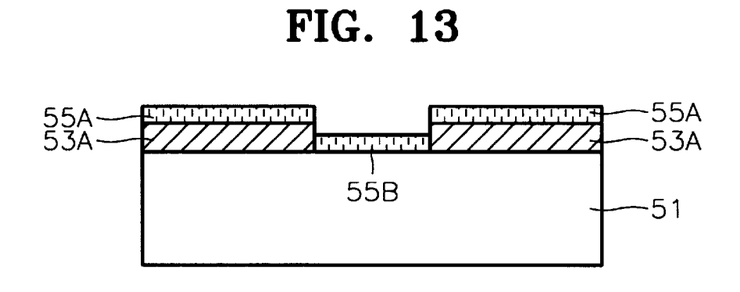

An annular reflector according to the present invention can be fabricated as illustrated in FIGS. 12 through 16. As shown in FIG. 12, a first patterned photoresist layer 53A is formed on the transparent substrate 51 by coating the substrate with a photoresist layer, selectively exposing the photoresist layer to irradiation, and then developing the photoresist layer. A continuous light absorbing layer having portions 55A on the patterned photoresist layer 53A and portion 55B on the exposed portion of the substrate 51 is then formed.

Figure 14:
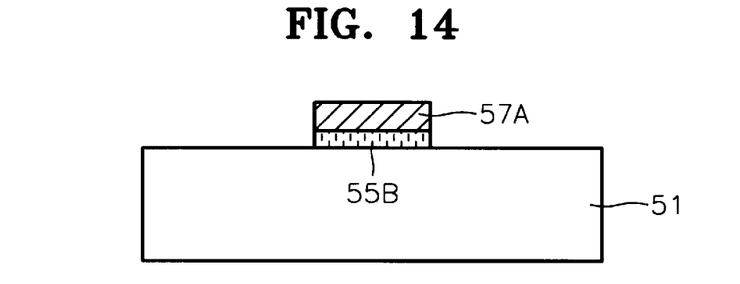
Figure 15:
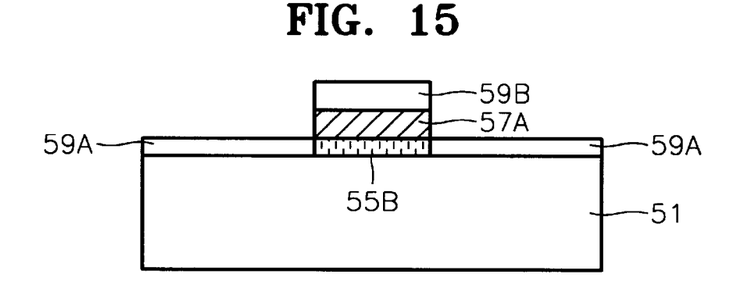

The portions of the light absorbing layer 55A on the patterned photoresist layer 53A can then be removed through a lift-off technique. In particular, the patterned photoresist layer 53A is removed thereby removing the portion of the light absorbing film thereon. Accordingly, only the portion of the light absorbing layer 55B on the substrate remains as shown in FIG. 14. A second patterned photoresist layer 57A is formed on the light absorbing layer 55B. A continuous light reflecting layer including portions 59A on the substrate and portion 59B on the second patterned photoresist layer 57A is formed as shown in FIG. 15. The continuous light reflecting layer can be formed by deposition or sputtering techniques as will be understood by one having skill in the art.

Figure 16:
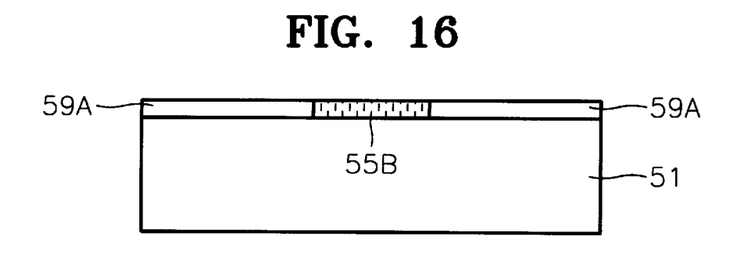

The portion 59B of the light reflecting layer on the second patterned photoresist layer 57A can then be removed through a lift-off technique. In particular, the second patterned photoresist layer 57A is removed thus removing the portion 59B of the light reflecting layer thereon. The completed annular reflector including a light absorbing layer 55B surrounded by a light reflecting layer 59A is illustrated in FIG. 16.

Another method for fabricating an annular reflector according to the present invention is illustrated in FIGS. 17 through 23. In particular, the annular reflector fabricated as shown in FIGS. 17 through 23 can both shift the phase of light and provide partial reflection.

Figure 17:
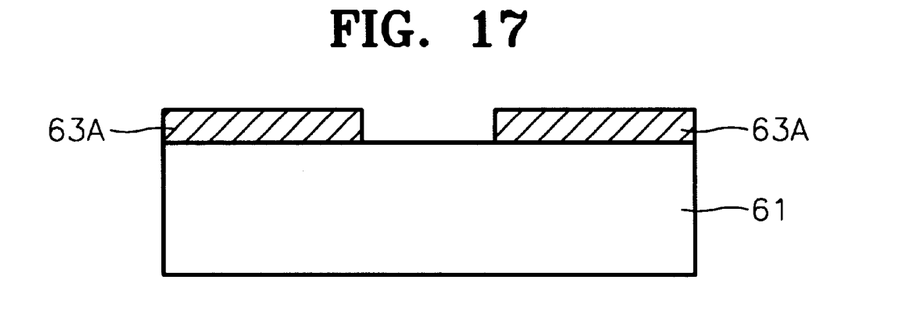
FIGS. 17–23 are sectional views illustrating an alternate method for fabricating an annular reflector according to the present invention.
Figure 18:
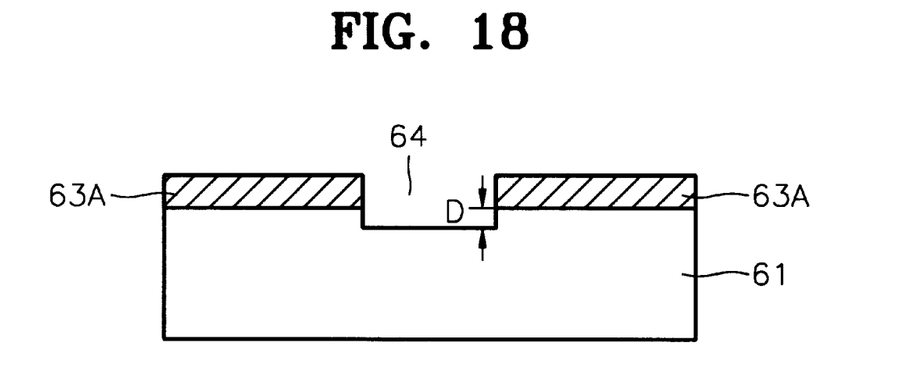

A first patterned photoresist layer 63A is formed on a transparent substrate 61 leaving a portion of the substrate exposed, as shown in FIG. 17. A groove 64 is formed in the substrate using the patterned photoresist layer 63A as an etching mask. In particular, the groove may be formed by a reactive ion- etching technique. The phase of light transmitted from the groove 64 can be inverted by controlling the depth D of the groove.

The desired depth D of the groove is determined by the wave length of the incident light according to the following formula:

$$D = \frac{\lambda}{2(n-1)}$$

In this formula, $\lambda$ denotes the wavelength of the light, and n denotes the refractive index of the substrate. By controlling the depth of the groove, the phase of the light reflected therefrom can be inverted (or shifted by 180°).

Figure 19:
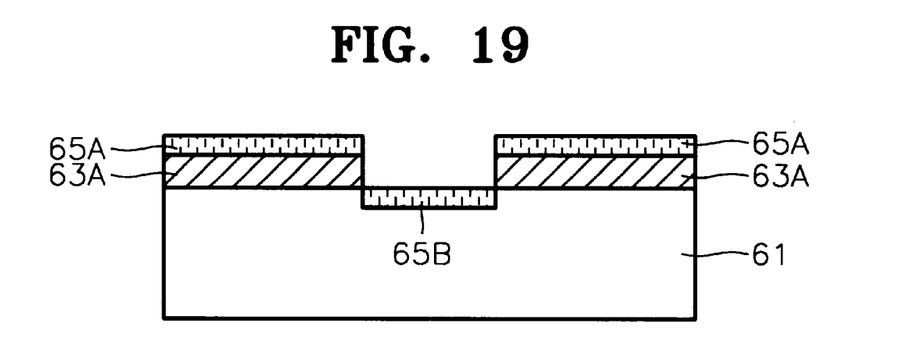
Figure 20:
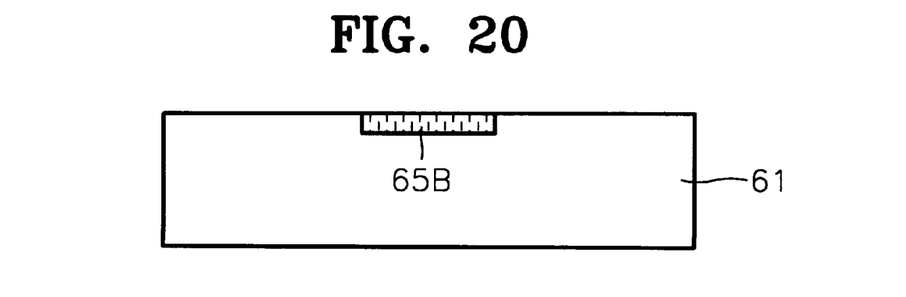

A continuous light reflecting layer including portions 65A on the patterned photoresist layer 63A and portion 65B in the groove is formed as shown in FIG. 19. This layer can be formed by deposition or sputtering techniques. The patterned photoresist layer 63A and the portion 65A of the light reflecting layer thereon is then removed through a lift-off technique leaving only light reflecting layer portion 65B as shown in FIG. 20. As previously discussed, by removing the patterned photoresist layer 63A, the light reflecting material thereon can be simultaneously removed.

Figure 21:
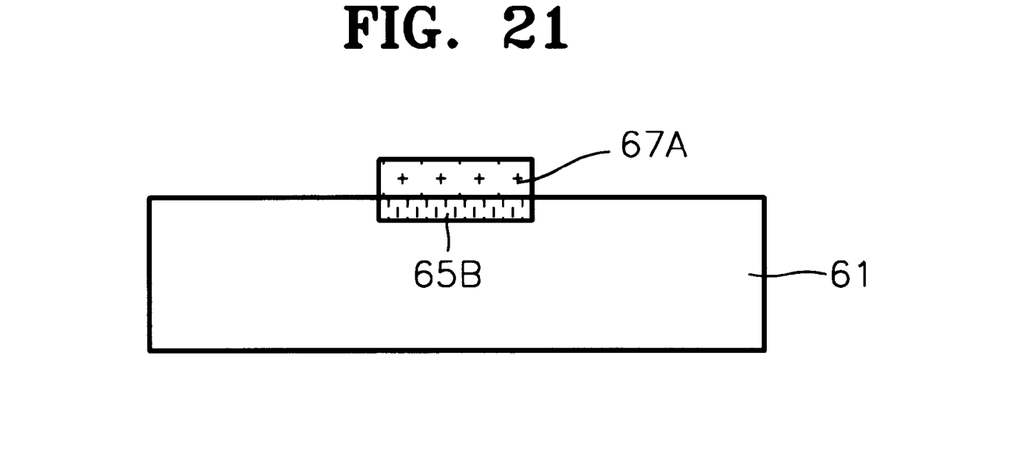

A second patterned photoresist layer 67A can then be formed on the light reflecting layer 65B as shown in FIG. 21. The patterned photoresist layer 67A can be formed by coating the whole surface of the substrate with a photoresist material. The photoresist material not on the reflecting layer 65B can be selectively exposed by illuminating the back side of the wafer. Accordingly, the light reflecting layer 65B acts as a mask. Alternately, the photoresist can be exposed from the front side using a conventional masking technique.

Figure 22:
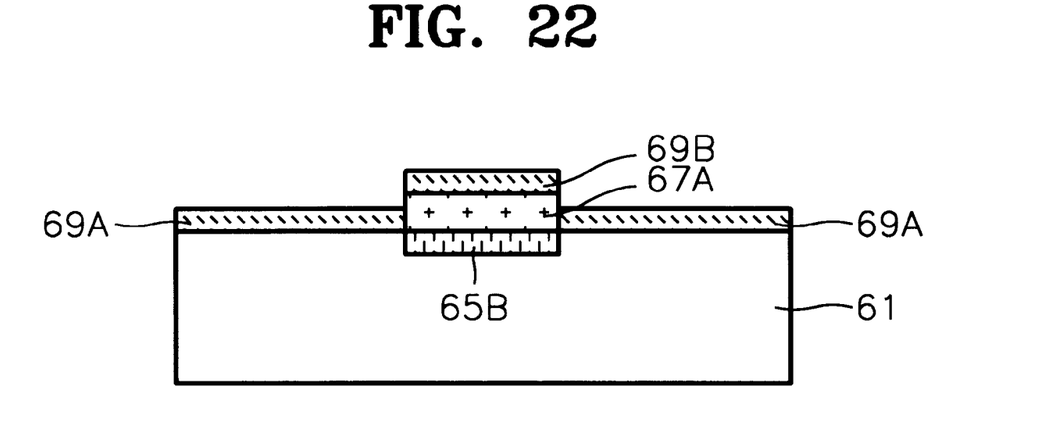
Figure 23:
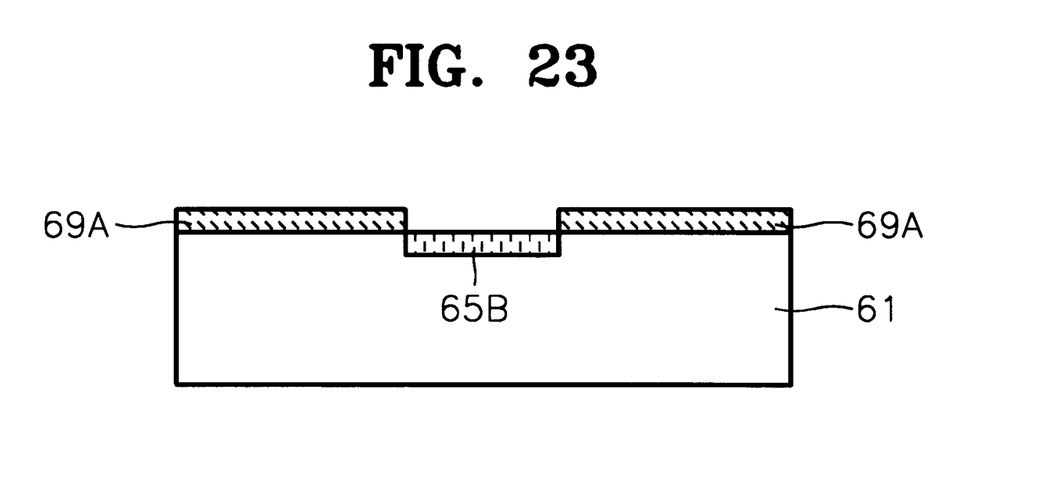

A second continuous light reflecting layer having portions 69A on the substrate and portion 69B on the patterned photoresist layer 67A is formed as shown in FIG. 22. This layer of light reflecting material can be formed by deposition or sputtering techniques. The reflector is completed by removing the patterned photoresist layer 67A and reflecting layer portion 69B thereon as shown in FIG. 23. The patterned photoresist layer 67A and reflecting layer portions 69B thereon can be removed using a lift-off technique as discussed above. The completed annular reflector of FIG. 23 can thus shift the phase of light reflected therefrom and also provide partial reflection.

Figure 24:
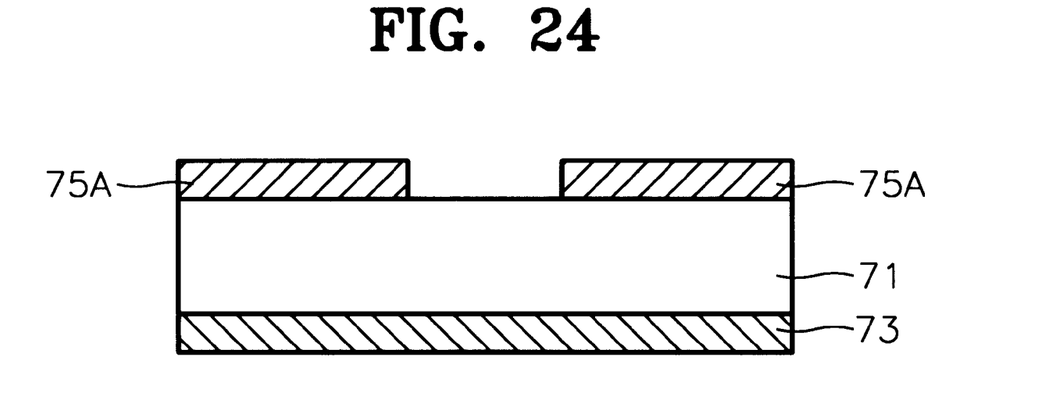
FIGS. 24–26 are sectional views illustrating another alternate method for fabricating an annular reflector according to the present invention.
Figure 25:
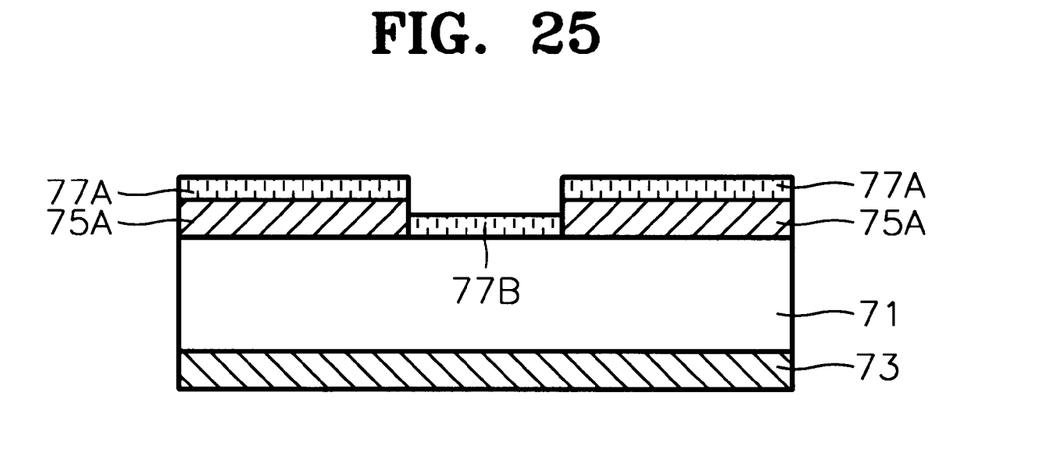
Figure 26:
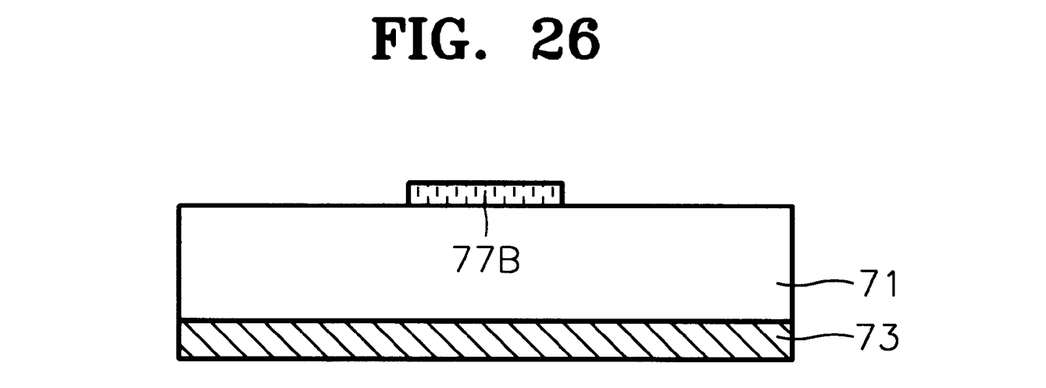

Still another method for fabricating an annular reflector which shifts the phase of light reflected therefrom and provides partial reflection is illustrated in FIGS. 24 through 26. A reflecting layer 73 is formed on a first face of the substrate 71. A second face of the substrate 71 opposite the first face is coated with photoresist and patterned to form the patterned photoresist layer 75A. The patterned photoresist layer 75A exposes a portion of the substrate where a phase-shifting layer is to be formed. A continuous phase-shifting layer having portions 77A on the patterned photoresist layer 75A and portion 77B on the exposed portion of the substrate is formed.

This continuous phase-shifting layer can be formed by deposition or sputtering techniques. This continuous phase-shifting layer is preferably formed using a material chosen from the group consisting of SOG, CrO, CrON, CrOCN, MoSiO, MoSiON or tungsten silicide (W/Si).

The patterned photoresist layer 75A and the portion 77A of the phase-shifting layer thereon can be simultaneously removed using a lift-off technique as discussed above to complete the annular reflector as shown in FIG. 26. The annular reflector of FIG. 26 can provide both phase-shifting and partial reflection according to the present invention.

Figure 27:
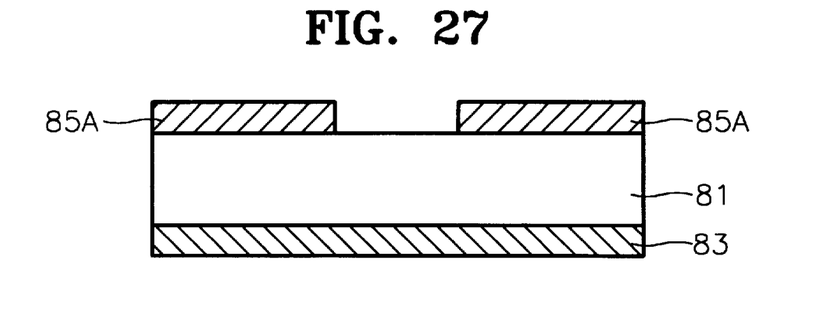
FIGS. 27–30 are sectional views illustrating still another alternate method for fabricating an annular reflector according to the present invention.

FIGS. 27 through 30 illustrate yet another method for fabricating an annular reflector according the present invention. The resulting annular reflector provides phase-shifting and partial reflection. As shown in FIG. 27, a reflecting layer 83 is formed on a first face of a transparent substrate 81. A patterned photoresist layer 85A is formed on a second face of the substrate opposite the first face. This patterned photoresist layer 85A exposes a portion of the substrate where a phase-shifting and partially reflecting layer is to be formed.

Figure 28:
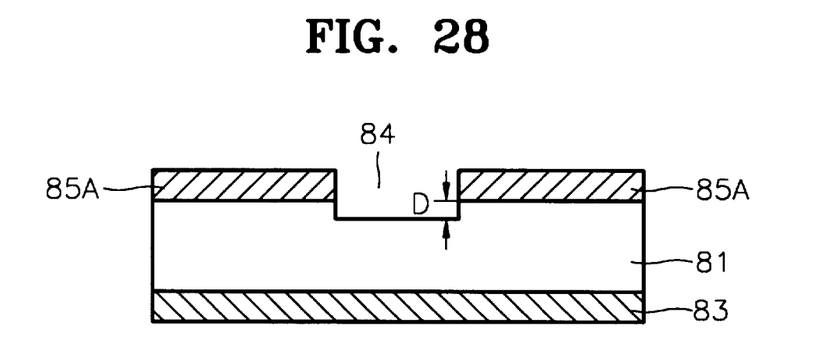

A groove 84 having a depth D is formed as shown in FIG. 28. In particular, the substrate 81 can be etched using the patterned photoresist layer 85A as a mask. More particularly, the etch can be a reactive ion etch. The phase of light reflected from the groove 84 can be inverted. The depth D of the groove 84 required to provide phase inversion can be determined by combining the formula described above with reference to FIG. 13 with the property of the phase-shifting material used to fill the groove.

Figure 29:
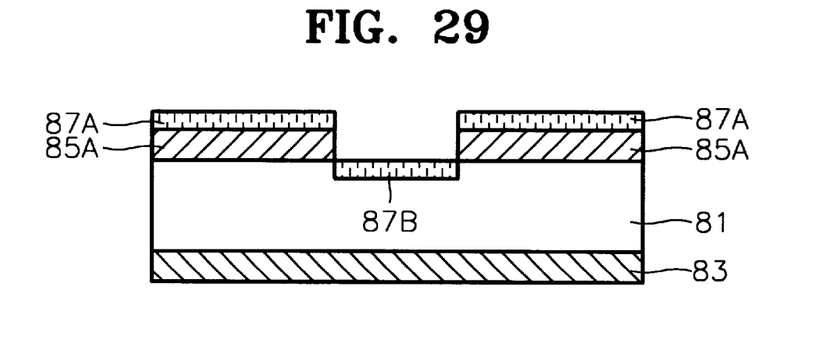
Figure 30:
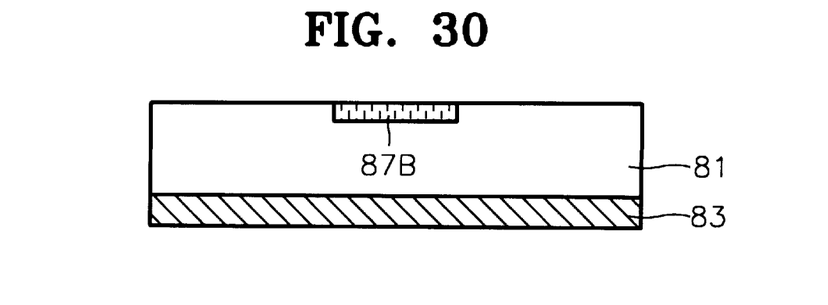

In FIG. 29, a continuous phase-shifting layer having portions 87A on the patterned photoresist layer 85A and portion 87B in the groove is formed. A material providing phase-shifting can be formed by deposition or sputtering techniques. Preferably, the phase-shifting layer is formed from a material chosen from the group consisting of SOG, CrO, CrON, CrOCN, MoSiO, MoSiON or tungsten silicide (W/Si). The patterned photoresist layer 85A and the phase-shifting layer portion 87A thereon can be simultaneously removed via a lift-off technique to provide the completed reflector shown in FIG. 30.

According to the present invention, a reflector can provide the function of a conventional modified aperture to transmit modified illumination to a mask. The modified illumination transmitted to the mask can have a uniform light intensity and irradiating angle as well as reduced diffraction to thereby enhance the uniformity of line widths formed on a wafer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A reflector for a photolithographic projection system which projects radiation along a path intersecting a wafer having a photosensitive layer thereon, said reflector comprising:

a transparent substrate having opposing first and second faces wherein said transparent substrate is transparent with respect to said projected radiation;

a phase-shifting layer on a first portion of said first face of said transparent substrate wherein a second portion of said first face of said transparent substrate is free of said phase-shifting layer; and a reflecting layer on first and second portions of said second face of said transparent substrate wherein said first portion of said second face is opposite said first portion of said first face having said phase-shifting layer thereon and wherein said second portion of said second face is opposite said second portion of said first face free of said phase-shifting layer.

2. A reflector according to claim 1 wherein said first and second portions of said first face of said transparent substrate define a planar surface.

3. A reflector according to claim 1 wherein said first portion of said first face is recessed with respect to said second portion of said first face.

4. A reflector according to claim 3 wherein said phase-shifting layer and said second portion of said first face define a planar surface.

5. A reflector according to claim 1 wherein said phase-shifting layer comprises a material chosen from the group consisting of spin-on-glass, CrO, CrON, CrOCN, MoSiO, MoSiON, and tungsten silicide.

6. A reflector according to claim 1 wherein said reflecting layer has a reflectivity of at least 80 percent with respect to said projected radiation.

* * * * *